(12) United States Patent
Nakai (10) Patent No.: US 12,189,371 B2
(45) Date of Patent: Jan. 7, 2025

(54) TRACE ASSISTANCE DEVICE AND TRACE ASSISTANCE METHOD

(71) Applicant: FUJI CORPORATION, Chiryu (JP)

(72) Inventor: Kenji Nakai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 392 days.

(21) Appl. No.: 17/641,231

(22) PCT Filed: Sep. 11, 2019

(86) PCT No.: PCT/JP2019/035605
§ 371 (c)(1),
(2) Date: Mar. 8, 2022

(87) PCT Pub. No.: WO2021/048933
PCT Pub. Date: Mar. 18, 2021

(65) Prior Publication Data
US 2022/0326689 A1 Oct. 13, 2022

(51) Int. Cl.
*G05B 19/418* (2006.01)

(52) U.S. Cl.
CPC ..... *G05B 19/4183* (2013.01); *G05B 19/4184* (2013.01); *G05B 2219/31288* (2013.01); *G05B 2219/31402* (2013.01)

(58) Field of Classification Search
CPC ............ G05B 19/4183; G05B 19/4184; G05B 2219/31288; G05B 2219/31402; G05B 23/0272; G05B 2219/32074; G05B 2219/45029; G06Q 10/063; G06Q 50/04; H05K 13/083; G06F 11/3476; G06F 2201/86; Y02P 90/02
See application file for complete search history.

(56) References Cited

U.S. PATENT DOCUMENTS

2019/0228520 A1* 7/2019 Nakamura ............ G06T 7/0004

FOREIGN PATENT DOCUMENTS

| JP | 2005-327909 A | 11/2005 |
| JP | 2006-165127 A | 6/2006 |
| JP | 2019-53639 A | 4/2019 |

OTHER PUBLICATIONS

International Search Report mailed on Dec. 10, 2019 in PCT/JP2019/035605 filed on Sep. 11, 2019 (1 page).

* cited by examiner

*Primary Examiner* — Charles R Kasenge
(74) *Attorney, Agent, or Firm* — Oblon, McClelland, Maier & Neustadt, L.L.P.

(57) ABSTRACT

A trace assistance device includes a memory section, an acquisition section, and an output section. The memory section stores a manipulation log and an operation log. When a predetermined trigger event occurs during the board work, the acquisition section acquires at least one target manipulation history related to the trigger event, a target operation history associated with the target manipulation history, a comparison manipulation history that is the same as or similar to the target manipulation history, and a comparison operation history associated with the comparison manipulation history from the manipulation log and the operation log stored in the memory device. The output section is configured to output an operation of the board production line recorded in the target operation history and an operation of the board production line recorded in the comparison operation history, which are acquired by the acquisition section, in a comparable manner.

13 Claims, 6 Drawing Sheets

| DATE AND TIME | HL0 AND ML0 |
|---|---|
| T 1 1 | H 1 1 |
| T 1 2 | M 1 1 |
| T 1 3 | H 1 2 |
| T 1 4 | M 1 2 |
| T 1 5 | M 1 3 |
| T 1 6 | H 1 3 |
| T 1 7 | M 1 4 |
| T 1 8 | H 1 4 |
| T 1 9 | M 1 5 |
| : | : |
| T 2 1 | H 1 1 |
| T 2 2 | M 2 1 |
| T 2 3 | M 2 2 |
| T 2 4 | H 1 2 |
| T 2 5 | M 2 3 |
| T 2 6 | H 1 5 |
| T 2 7 | M 2 4 |
| : | : |
| T 3 1 | H 1 1 |
| T 3 2 | M 3 1 |
| T 3 3 | M 3 2 |
| T 3 4 | H 1 2 |
| T 3 5 | M 3 3 |
| T 3 6 | TRIGGER EVENT OCCURS |

Fig. 7B

| SELECT | DATE AND TIME | T H O |
|---|---|---|
| | T 1 1 | H 1 1 |
| | T 1 3 | H 1 2 |
| | T 1 6 | H 1 3 |
| | T 2 1 | H 1 1 |
| | T 2 4 | H 1 2 |
| O | T 3 1 | H 1 1 |
| O | T 3 4 | H 1 2 |

Fig. 7C

| DATE AND TIME | T M O |
|---|---|
| T 3 2 | M 3 1 |
| T 3 3 | M 3 2 |
| T 3 5 | M 3 3 |

Fig. 7D

| SELECT | DATE AND TIME | C H O |
|---|---|---|
| | T 1 1 | H 1 1 |
| O | T 2 1 | H 1 1 |

Fig. 7E

| DATE AND TIME | C M O |
|---|---|
| T 2 2 | M 2 1 |
| T 2 3 | M 2 2 |
| T 2 5 | M 2 3 |

| COMMUNICATION DIRECTION | COMMUNICATION CONTENT | | COMMUNICATION DIRECTION | COMMUNICATION CONTENT |
|---|---|---|---|---|
| WM→6 | CD11 | | WM→6 | CD21 |
| 6→WM | CD12 | | 6→WM | CD22 |
| WM→6 | CD13 | | WM→6 | CD23 |
|  |  | | |  |
| WM→6 | CD14 | | WM→6 | CD24 |
|  |  | | |  |
| WM→6 | CD15 | | WM→6 | CD25 |
| 6→WM | CD16 | | 6→WM | CD26 |
| WM→6 | CD17 | | WM→6 | CD27 |
|  |  | | |  |
| 6→WM | CD18 | | 6→WM | CD28 |

TRACE ASSISTANCE DEVICE AND TRACE ASSISTANCE METHOD

TECHNICAL FIELD

The present description discloses the technology relating to a trace assistance device and a trace assistance method.

BACKGROUND ART

A collection method of component mounting information disclosed in Patent Literature 1 includes a component mounting information collection step and a memory step. In the component mounting information collection step, the component mounting information (logging information) generated in a component mounting step by a component mounting device is collected. In the memory step, the collected component mounting information (logging information) is stored in a memory. As a result, in the collection method of the component mounting information disclosed in Patent Literature 1, it attempts to easily analyze a problem that occurs during the component mounting step.

Patent Literature

Patent Literature 1: JP-A-2006-165127

BRIEF SUMMARY

Technical Problem

However, the logging information disclosed in Patent Literature 1 includes various pieces of information, such as a board number, a mounting position of the component, a component name of the component, a mounting condition of the component, a predetermined actual measurement value when the component is mounted, and an acquired image. In addition, the mounting condition of the component includes various conditions, such as a set value of a head position of a bonding head used when the component is mounted, a set value of a head pressure, and a set value of a head temperature. As described above, a type of logging information is large, and an amount of information of the logging information stored in the memory is likely to be increased. Therefore, for example, when a trigger event such as a work error occurs, it is difficult to acquire and compare the logging information related to the trigger event from various pieces of the gathered logging information.

In view of such a circumstance, the present description discloses a trace assistance device and a trace assistance method that output an operation of a board production line related to a trigger event and an operation of a board production line to be compared, in a comparable manner, from an operation log in which multiple operation histories of the board production line are recorded.

Solution to Problem

The present description discloses a trace assistance device including a memory section, an acquisition section, and an output section. The memory section is configured to store a manipulation log in which multiple manipulation histories of an operator with respect to a board production line including a board work machine configured to perform predetermined board work on a board are recorded, and an operation log in which multiple operation histories of the board production line actuated due to a manipulation of the operator are recorded in association with each other in a memory device. The acquisition section is configured to, when a predetermined trigger event occurs during the board work, acquire a target manipulation history, a target operation history, a comparison manipulation history, and a comparison operation history from the manipulation log and the operation log stored in the memory device. The target manipulation history is at least one manipulation history related to the trigger event. The target operation history is at least one operation history associated with the target manipulation history. The comparison manipulation history is at least one manipulation history that is the same as or similar to the target manipulation history. The comparison operation history is at least one operation history associated with the comparison manipulation history. The output section is configured to output an operation of the board production line recorded in the target operation history and an operation of the board production line recorded in the comparison operation history, which are acquired by the acquisition section, in a comparable manner.

In addition, the present description relates to a trace assistance method including a memory step, an acquisition step, and an output step. In the memory step, a manipulation log in which multiple manipulation histories of an operator with respect to a board production line including a board work machine configured to perform predetermined board work on a board are recorded, and an operation log in which multiple operation histories of the board production line actuated due to a manipulation of the operator are recorded are stored in association with each other in a memory device. In the acquisition step, when a predetermined trigger event occurs during the board work, a target manipulation history, a target operation history, a comparison manipulation history, and a comparison operation history are acquired from the manipulation log and the operation log stored in the memory device. The target manipulation history is at least one manipulation history related to the trigger event. The target operation history is at least one operation history associated with the target manipulation history. The comparison manipulation history is at least one manipulation history that is the same as or similar to the target manipulation history. The comparison operation history is at least one operation history associated with the comparison manipulation history. In the output step, an operation of the board production line recorded in the target operation history and an operation of the board production line recorded in the comparison operation history, which are acquired in the acquisition step, are output in a comparable manner.

Advantageous Effect

A trace assistance device includes a memory section, an acquisition section, and an output section. Accordingly, the trace assistance device can output an operation of a board production line recorded in a target operation history associated with a target manipulation history related to a trigger event and an operation of the board production line recorded in a comparison operation history associated with a comparison manipulation history, which is the same as or similar to the target manipulation history, in a comparable manner. The above description of the trace assistance device can be similarly applied to a trace assistance method.

DESCRIPTION OF EMBODIMENTS

1. Embodiment 1-1. Configuration Example of Board Production Line 1

Figure 1:
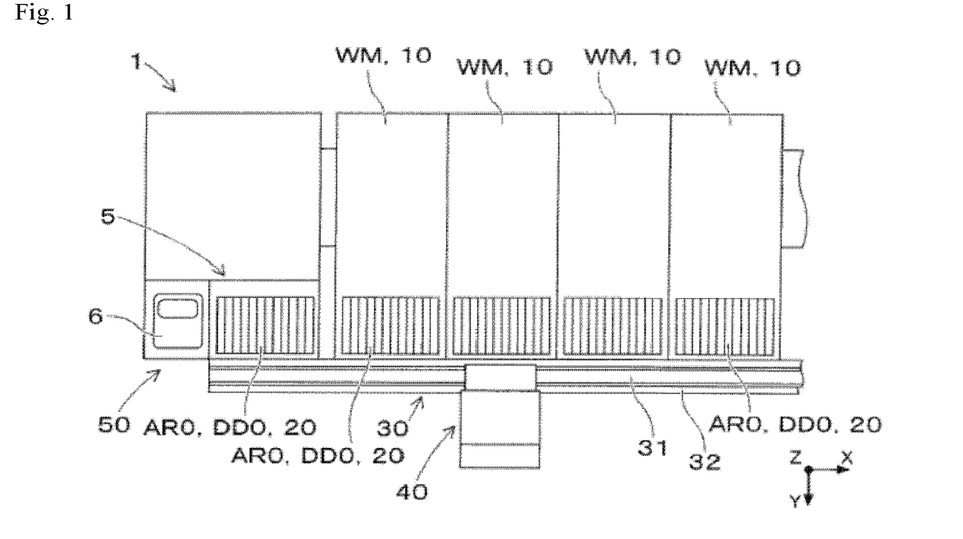
FIG. 1 is a plan view showing a configuration example of a board production line.

As shown in FIG. 1, board production line 1 includes at least one (four in FIG. 1) component mounter 10, exchange system 30, article moving device 40, storage device 5, and line control computer 6. Four component mounters 10 are installed along a conveyance direction of board 90 shown in FIG. 2. Component mounter 10 is included in board work machine WM that performs predetermined board work on board 90. The board work by component mounter 10 includes a carrying-in operation and a carrying-out operation of board 90, a pick-up operation and a mounting operation of a component, and the like. Component mounter 10 is detachably provided with, for example, cassette-type feeder 20.

Storage device 5 used, for example, for storing feeder 20 is installed on a board carrying-in side (on a paper left side of FIG. 1) of board production line 1. In addition, board production line 1 is provided with exchange system 30 and article moving device 40, and performs a replenishment operation, an exchange operation, and a collection operation of feeder 20. It should be noted that a configuration of board production line 1 can be appropriately added or changed depending on, for example, a type of a board product to be produced. Specifically, for example, board work machine WM, such as a solder printing machine, an inspection machine, or a reflow furnace, can be appropriately installed in board production line 1.

Each device constituting board production line 1 is configured to be able to input and output various data to and from line control computer 6 via a network. For example, storage device 5 includes multiple slots. Storage device 5 stores feeder 20 equipped in multiple slots. Feeder 20 equipped in the slot of storage device 5 is placed in a state capable of communicating with line control computer 6. As a result, the slot of storage device 5 and an identification code of feeder 20 equipped in the slot are recorded in line control computer 6 in association with each other.

In addition, line control computer 6 monitors an operating status of board production line 1, and integrally controls board work machine WM, such as component mounter 10, exchange system 30, article moving device 40, and storage device 5. Various data for controlling board work machine WM, exchange system 30, article moving device 40, and storage device 5 are stored in line control computer 6. Line control computer 6 transmits various data, such as a control program, when, for example, component mounter 10 executes a mounting process of the component.

1-2. Configuration Example of Component Mounter 10

Figure 2:
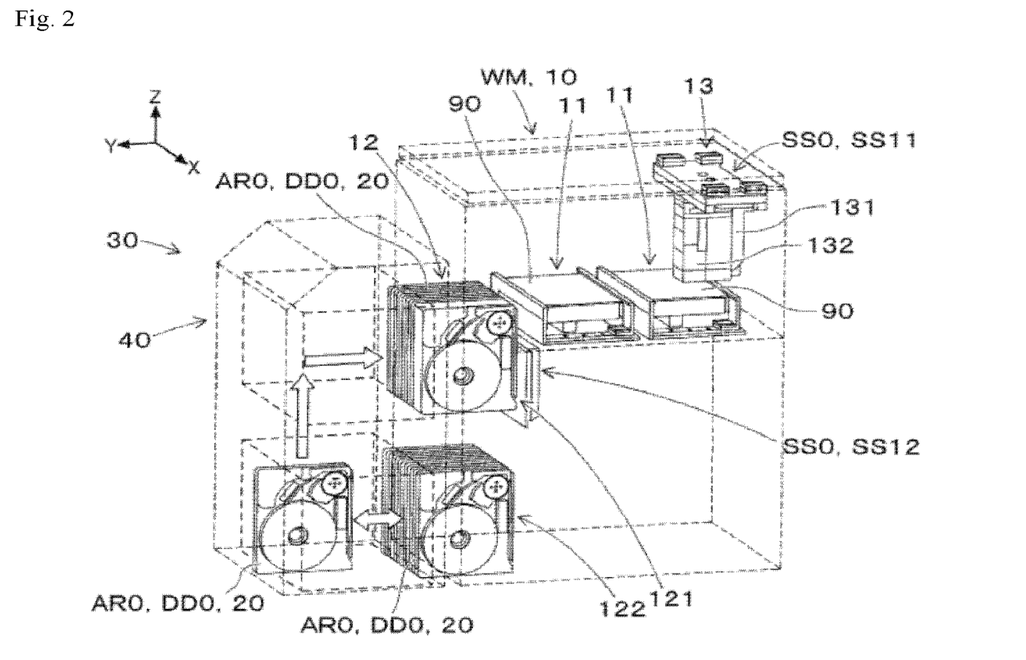
FIG. 2 is a perspective view showing a schematic configuration of an exchange system and a component mounter in FIG. 1.

As shown in FIG. 2, each of four component mounters 10 includes board conveyance device 11, component supply device 12, and head driving device 13. In the following description, it is assumed that a horizontal width direction of component mounter 10, which is the conveyance direction of board 90, is an X-direction, a horizontal depth direction of component mounter 10 is a Y-direction, and a vertical direction (paper up-down direction of FIG. 2) perpendicular to the X-direction and the Y-direction is a Z-direction.

Board conveyance device 11 is configured by, for example, a belt conveyor and a positioning device. Board conveyance device 11 sequentially conveys board 90 in the conveyance direction, and positions board 90 at a predetermined position in the device. Board conveyance device 11 conveys board 90 out of component mounter 10 after the mounting process by component mounter 10 is terminated.

Component supply device 12 supplies component to be mounted on board 90. Component supply device 12 includes first slot 121 and second slot 122 that can be equipped with multiple feeders 20. In the present embodiment, first slot 121 is disposed in an upper part of a front side of component mounter 10 to hold equipped feeder 20 in an operable manner. An operation of feeder 20 equipped in first slot 121 is controlled in the mounting process by component mounter 10 to supply the component in an extraction section provided at a defined position on an upper part of feeder 20.

In the present embodiment, second slot 122 is disposed below first slot 121 to store equipped feeder 20. That is, second slot 122 preliminarily holds feeder 20 used for production, or temporarily holds used feeder 20 used for production. It should be noted that the exchange operation of feeder 20 between first slot 121 and second slot 122 is performed by article moving device 40.

In addition, when feeder 20 is equipped in first slot 121 or second slot 122 of component supply device 12, electric power is supplied from component mounter 10 via a connector. Moreover, feeder 20 is placed in a state capable of communicating with component mounter 10. Feeder 20 equipped in first slot 121 controls a feeding operation of a carrier tape accommodating the component based on a control instruction or the like by component mounter 10. As a result, feeder 20 supplies the component in the extraction section provided in the upper part of feeder 20 so as to be able to be picked up by a holding member of mounting head 132.

Head driving device 13 moves moving body 131 in the horizontal direction (X-direction and Y-direction) by a linear motion mechanism. Mounting head 132 is fixed to moving body 131 by a clamp member in an exchangeable (detachable) manner. Mounting head 132 is moved in the XY-directions integrally with moving body 131 by the linear motion mechanism of head driving device 13. Mounting head 132 picks the component supplied by component supply device 12 up by the holding member. As the holding member, for example, a suction nozzle that picks the component up by supplied negative pressure air, a chuck that grips the component, or the like can be used.

Mounting head 132 holds the holding member so as to be movable in the Z-direction and to be rotatable around a Q-axis parallel to the Z-axis. Mounting head 132 adjusts a position and an angle of the holding member depending on a posture of the picked up component. Moreover, mounting head 132 mounts the component to a mounting position of board 90 as instructed by the control program. A total time of a time required for a predetermined number of cycles of a pick-and-place cycle of the component and a time required for carrying board 90 in and out is a cycle time per board 90.

It should be noted that the holding member provided in mounting head 132 can be appropriately changed depending on a type of component in the mounting process of mounting the component on board 90. Component mounter 10 attaches the suction nozzle accommodated in a nozzle station to mounting head 132, for example, in a case in which the suction nozzle used in the mounting process to be executed is not attached to mounting head 132. The nozzle station is detachably equipped in a predetermined position in component mounter 10.

1-3. Configuration Example of Feeder 20

Figure 3:
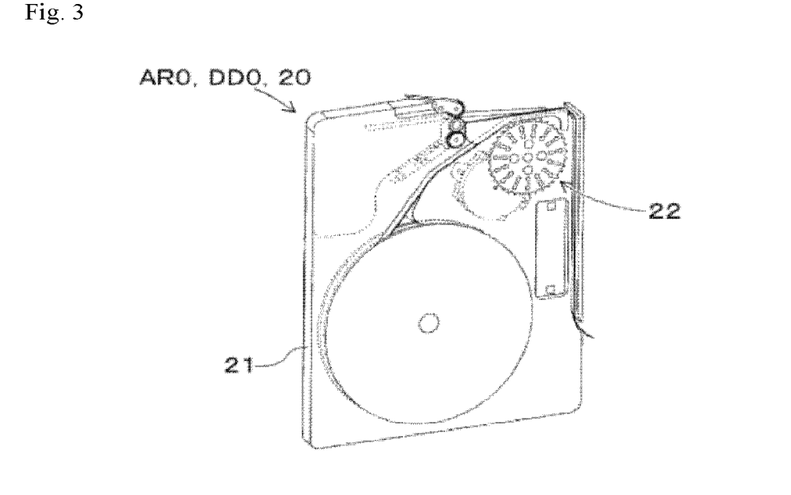
FIG. 3 is a perspective view showing an external appearance of a feeder shown in FIG. 2.

As shown in FIG. 3, feeder 20 includes feeder main body 21 and driving device 22. Feeder main body 21 of the present embodiment is formed in a flat box shape. Feeder main body 21 holds a reel on which the carrier tape accommodating a large number of components is wound in a detachable (exchangeable) manner. Driving device 22 includes a sprocket that engages a feeding hole provided in the carrier tape. Driving device 22 rotates the sprocket to feed and move the carrier tape.

An operation of driving device 22 of feeder 20 is controlled by a control device (not shown). When feeder 20 is equipped in first slot 121 of component mounter 10, feeder 20 receives the electric power supplied from component mounter 10 via the connector. As a result, the control device of feeder 20 is placed in a state capable of communicating with component mounter 10. The same applies to second slot 122 as described above with respect to first slot 121. As a result, component mounter 10 can detect the replenishment and the collection of feeder 20 in first slot 121 and second slot 122.

1-4. Configuration Examples of Exchange System 30 and Article Moving Device 40

As shown in FIG. 1 and FIG. 2, exchange system 30 includes first rail 31 and second rail 32. First rail 31 and second rail 32 form a traveling path of article moving device 40. First rail 31 is provided along an arrangement direction of four component mounters 10, and is provided between first slot 121 and second slot 122 in the up-down direction (Z-direction). Second rail 32 is provided along the arrangement direction of four component mounters 10, and is provided below second slot 122 in the up-down direction (Z-direction). First rail 31 and second rail 32 extend over substantially the entire area in the conveyance direction of board 90 in board production line 1.

Article moving device 40 is provided so as to be able to travel along the traveling path formed by first rail 31 and second rail 32. Article moving device 40 receives the electric power supplied from a power transmission section by non-contact power supply, for example, via a power receiving section provided to face the power transmission section provided in first rail 31. The electric power received by the power receiving section is used for traveling of article moving device 40, a predetermined operation, or the like via a power receiving circuit. It should be noted that article moving device 40 detects, for example, a position (current position) on the traveling path by a position detection device. As the position detection device, for example, an optical detection method, a detection method using electromagnetic induction, or the like can be applied.

The "predetermined operation" includes an exchange operation for exchanging device DD0 detachably provided in board work machine WM, such as component mounter 10, with board work machine WM. In the present embodiment, article moving device 40 uses feeder 20 that supplies the component to be mounted on board 90 as device DD0, and performs the exchange operation of feeder 20 with component mounter 10, which is board work machine WM, and storage device 5.

In the present embodiment, article moving device 40 conveys feeder 20 from storage device 5 to first slot 121 or second slot 122 of component mounter 10, and performs the replenishment operation of feeder 20. In addition, article moving device 40 performs the exchange operation of feeder 20 between first slot 121 and second slot 122 of component mounter 10. Further, article moving device 40 conveys feeder 20, which is no longer needed, from component mounter 10 to storage device 5, and performs the collection operation of feeder 20.

Figure 4:
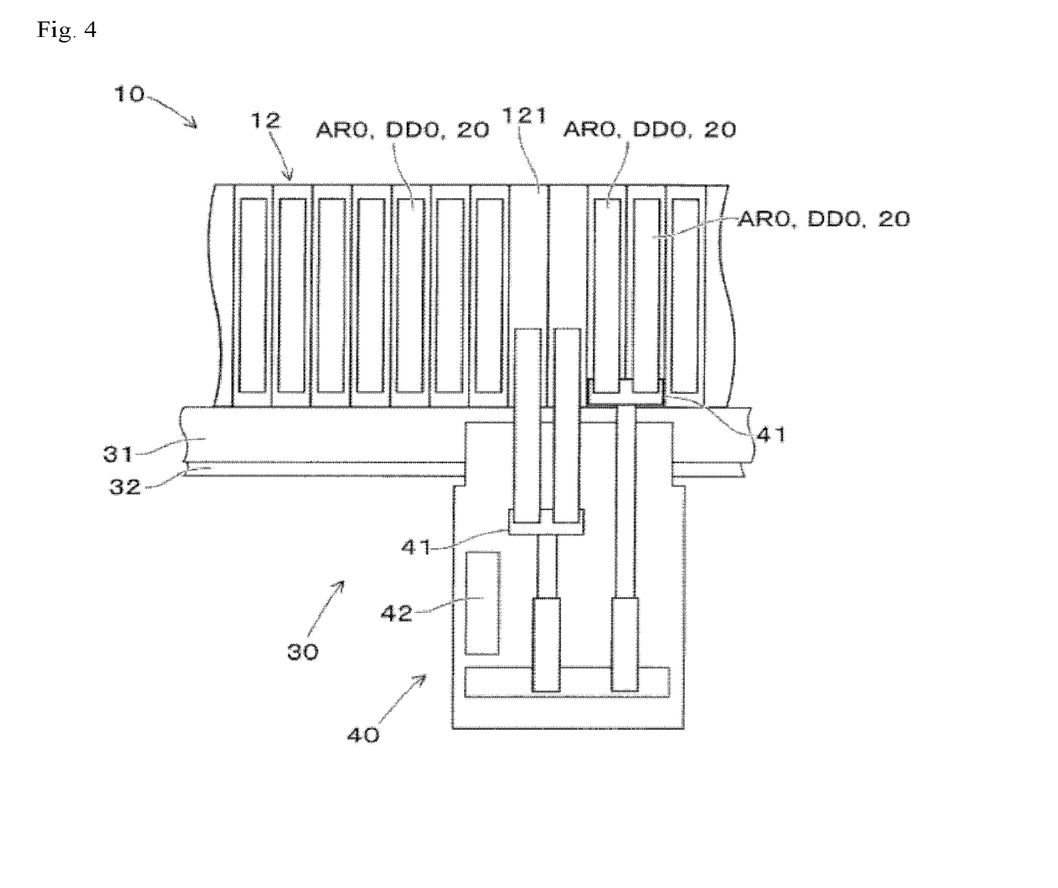
FIG. 4 is a plan view showing an example of an exchange operation of the feeder between an article moving device and a component supply device of the component mounter.

As shown in FIG. 4, article moving device 40 includes at least one (two in FIG. 4) holding section 41 and control device 42. In the present embodiment, each of two holding sections 41 can simultaneously clamp multiple (two in FIG. 4) feeders 20, and can simultaneously hold multiple (two) feeders 20. In addition, each of two holding sections 41 is independently movable along an attachment/detachment direction (Y-direction in the present embodiment) of feeder 20 by, for example, the linear motion mechanism or the like, and can simultaneously move multiple (two) feeders 20 along the Y-direction.

Further, two holding sections 41 are integrally movable in the up-down direction (Z-direction) by, for example, the linear motion mechanism or the like, and can simultaneously move multiple (four) feeders 20 in the Z-direction. It should be noted that article moving device 40 can include, for example, multiple (four) holding sections 41. In this case, each of multiple (four) holding sections 41 clamps one feeder 20, so that multiple (four) feeders 20 can be moved independently in the Y-direction and the Z-direction. In addition, a form of holding section 41 is not limited to the clamp mechanism and the linear motion mechanism, and can have various forms. For example, holding section 41 can include a protruding portion that can be fitted into a hole portion provided in feeder 20. In this case, feeder 20 is held by fitting the protruding portion of holding section 41 into the hole portion of feeder 20.

Control device 42 includes a well-known computing device and a memory device, in which a control circuit is configured (all not shown). Control device 42 is connected to four component mounters 10, exchange system 30, storage device 5, and line control computer 6 in a communicable manner. Control device 42 controls the traveling of article moving device 40, the operations of two holding sections 41, and the like. With the configuration described above, article moving device 40 can be moved to a predetermined position along first rail 31 and second rail 32, and can perform the exchange operation of feeder 20 at a stopping position.

1-5. Configuration Example of Trace Assistance Device 50

Board production line 1 acquires various operation histories related to the production of board product in each of board work machine WM, article moving device 40, and storage device 5. The acquired operation history of board production line 1 is stored in memory device 6DS shown in FIG. 5. Moreover, for example, when a trigger event, such as a work error, occurs, an engineer who is a manufacturer or a user of board production line 1 acquires the operation history of board production line 1 related to the trigger event from memory device 6DS, and performs a factor analysis of the trigger event based on the acquired operation history.

However, since a type of the operation history of board production line 1 is large, an amount of information of the operation history stored in memory device 6DS is likely to be increased. Therefore, when the trigger event occurs, it is difficult to acquire and compare the operation history related to the trigger event from various stored operation histories. Accordingly, trace assistance device 50 is provided in board production line 1 of the present embodiment. Trace assistance device 50 outputs, in a comparable manner, the operation of board production line 1 related to the trigger event and the operation of board production line 1 to be compared from operation log ML0 in which multiple operation histories of board production line 1 are recorded.

Figure 5:
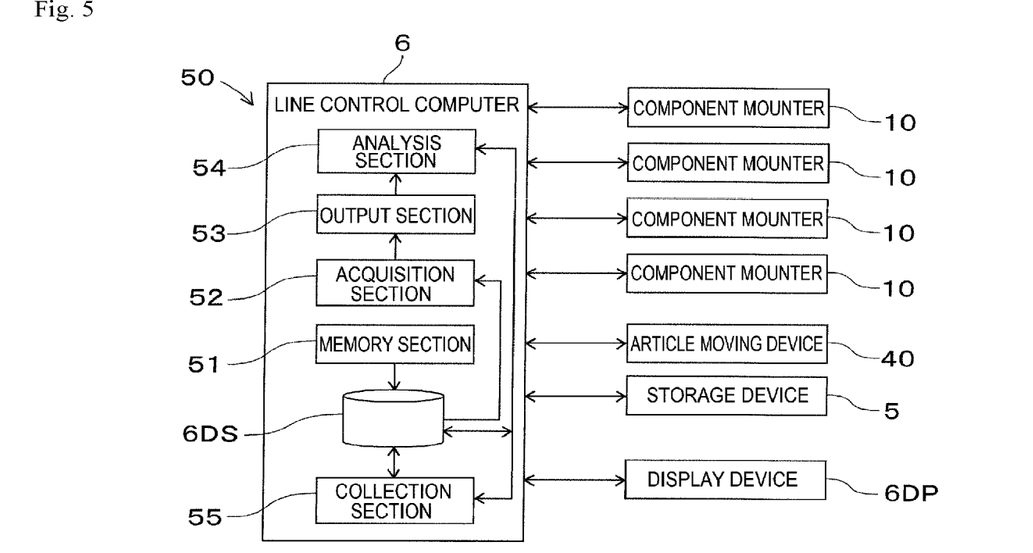
FIG. 5 is a block diagram showing an example of a control block of a trace assistance device.

As shown in FIG. 5, when regarded as a control block, trace assistance device 50 includes memory section 51, acquisition section 52, and output section 53. Trace assistance device 50 can further include analysis section 54, or can include both analysis section 54 and collection section 55. Trace assistance device 50 according to the present embodiment includes memory section 51, acquisition section 52, output section 53, analysis section 54, and collection section 55.

Trace assistance device 50 can be provided in various control devices and computing devices. Trace assistance device 50 of the present embodiment is provided in line control computer 6, and memory device 6DS is provided in line control computer 6. Trace assistance device 50 can be provided, for example, in a management device (not shown) that manages multiple board production lines 1. In addition, trace assistance device 50 can also be formed on a cloud.

Figure 6:
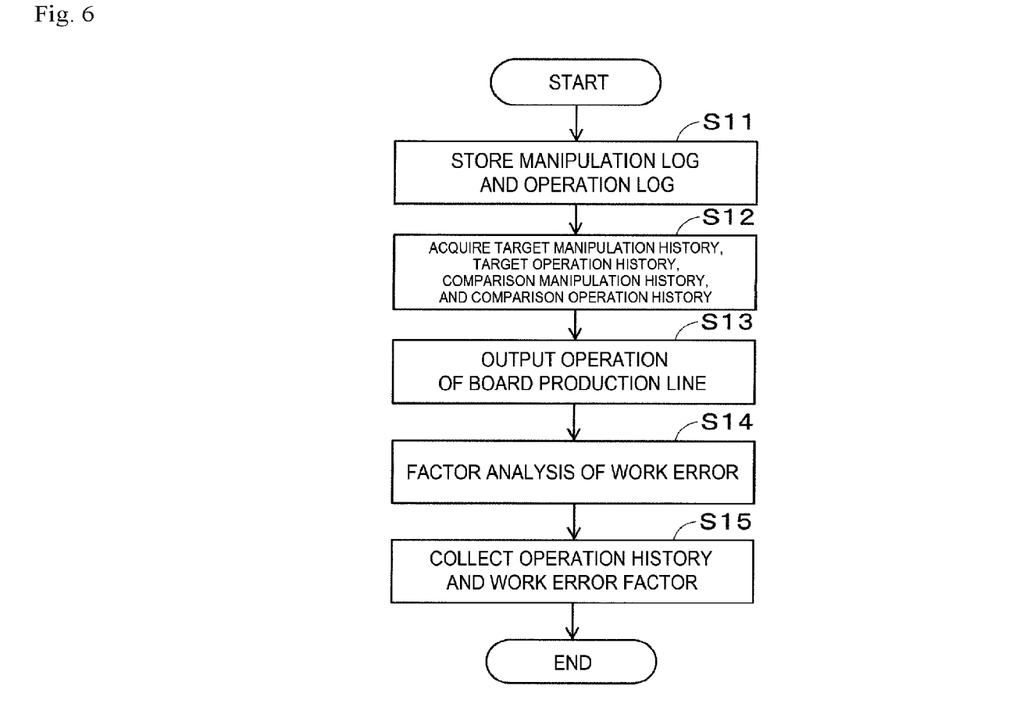
FIG. 6 is a flowchart showing an example of a control procedure by the trace assistance device.

Trace assistance device 50 executes a control in accordance with the flowchart shown in FIG. 6. Memory section 51 performs a process shown in step S11. Acquisition section 52 performs a process shown in step S12. Output section 53 performs a process shown in step S13. Analysis section 54 performs a process shown in step S14. Collection section 55 performs a process shown in step S15.

1-5-1. Memory Section 51

Memory section 51 stores manipulation log HL0 in which multiple manipulation histories of the operator with respect to board production line 1 are recorded, and operation log ML0 in which multiple operation histories of board production line 1 actuated due to the manipulation of the operator are recorded in memory device 6DS in association with each other (step S11 shown in FIG. 6).

Manipulation log HL0 need only be any log in which the manipulation history of the operator with respect to board production line 1 is recorded, and the manipulation of the operator is not limited. For example, the operator can give various instructions to board production line 1 by using display device 6DP provided in board production line 1 shown in FIG. 5. For example, the operator can instruct board production line 1 to start and stop the production of the board product.

In addition, the operator can instruct board production line 1 to start or terminate the mounting operation or a detachment operation of device DD0 detachably provided in board work machine WM. In a case in which board work machine WM is component mounter 10, for example, feeder 20, the reel or a component tray that accommodates multiple components, mounting head 132, the holding member (suction nozzle, chuck, or the like), the nozzle station, and the like are included in device DD0. In a case in which board work machine WM is the solder printing machine, for example, a mask, a squeegee, a dispense head, and the like are included in device DD0. In a case in which board work machine WM is the inspection machine, for example, an inspection head and the like are included in device DD0.

Further, the operator can instruct board production line 1 to change an operation condition of board production line 1, such as changing the control program for driving board production line 1. As described above, the manipulation of the operator includes an instruction for changing the configuration of board production line 1, an instruction for changing the operation condition of board production line 1, and the like. The manipulation (manipulation content) performed by the operator is recorded in manipulation log HL0 as the manipulation history together with the date and time when the manipulation is performed.

Operation log ML0 need only be a record of the operation history of board production line 1 actuated due to the manipulation of the operator, and the operation of board production line 1 is not limited. In the example described above, the production of the board product in board production line 1 is started due to an instruction of the operator for starting the production of the board product. In addition, the production of the board product in board production line 1 is stopped due to an instruction of the operator for stopping the production of the board product.

Further, due to the instruction by the operator for changing the configuration of board production line 1, the configuration of board production line 1 is changed, and board production line 1 having the changed configuration is actuated. In addition, due to the instruction by the operator for changing the operation condition of board production line 1, the operation condition of board production line 1 is changed, and board production line 1 having the changed operation condition is actuated.

For example, in a case in which board work machine WM is component mounter 10, when the component mounting operation is performed as the board work, the operation history of each device is recorded in operation log ML0 together with the date and time when the operation history of each device is executed. For example, the operation history of each of board conveyance device 11, component supply device 12, and head driving device 13 shown in FIG. 2 is recorded in operation log ML0. It should be noted that identification information for specifying the device to be used by each device is also recorded in operation log ML0.

As memory device 6DS, for example, a magnetic memory device such as a hard disk device, a memory device using a semiconductor element, such as a flash memory, or the like can be used. Memory device 6DS stores manipulation log HL0 and operation log ML0 in association with each other. Memory section 51 can store manipulation log HL0 and operation log ML0 in memory device 6DS in association with each other, for example, based on the date and time when the event occurs. Specifically, memory section 51 can associate manipulation log HL0 and operation log ML0 with each other based on the date and time when the manipulation by the operator is performed and the date and time when the operation of board production line 1 occurs.

Figure 7A:
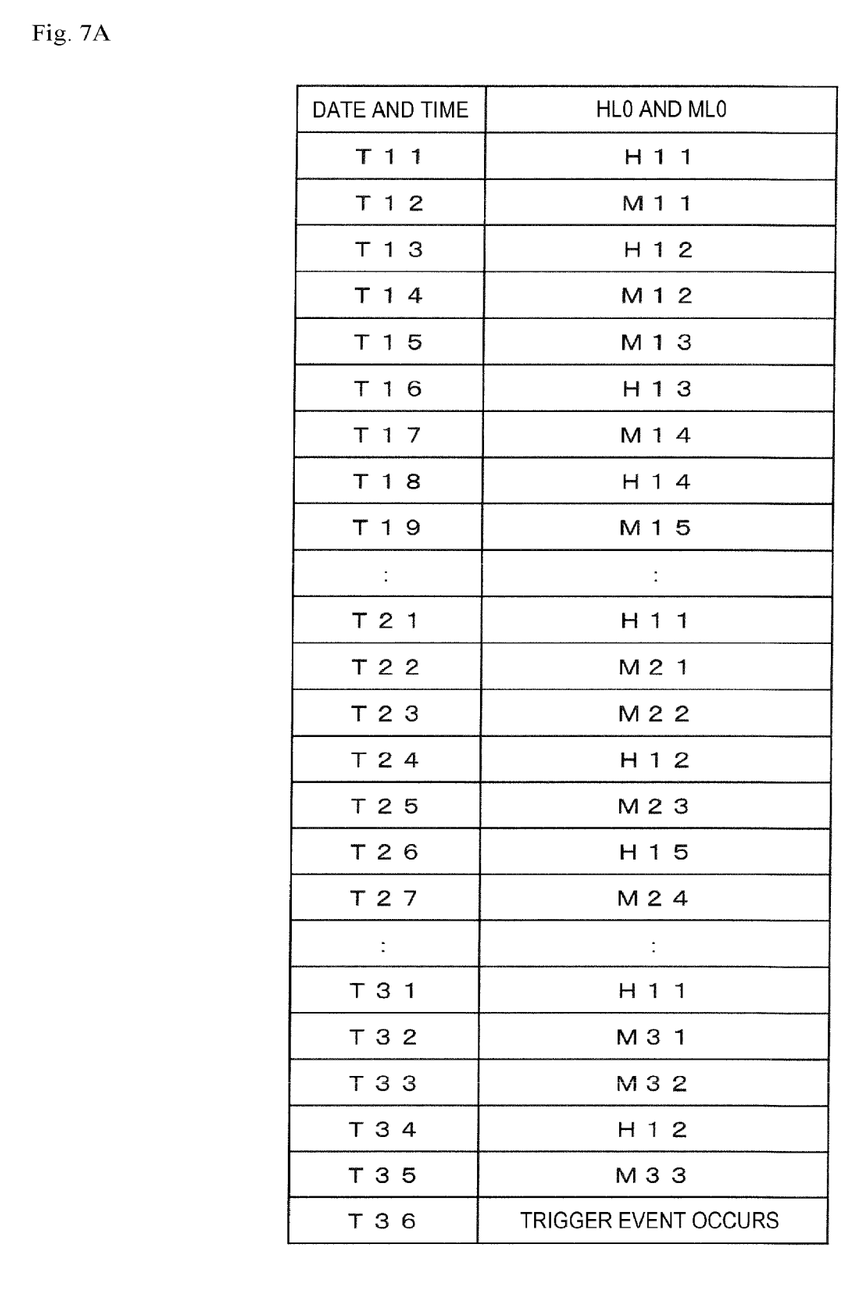
FIG. 7A is a schematic view showing examples of a manipulation log and an operation log.

FIG. 7A shows examples of manipulation log HL0 and operation log ML0. For example, at date and time T11, a predetermined manipulation is performed by the operator, and manipulation history H11 is recorded. At date and time T12, board production line 1 is actuated due to the manipulation by the operator, and operation history M11 is recorded. Operation history M11 represents, for example, a set of the operation histories of each device of component mounter 10. In the following, manipulation history H12 to manipulation history H15 are recorded in the same manner. In addition, in the same manner, operation history M12 to operation history M15, operation history M21 to operation history M24, and operation history M31 to operation history M33 are recorded.

It should be noted that manipulation log HL0 and operation log ML0 may be stored in one file as shown in FIG. 7A, or may be divided into multiple files and stored. For example, memory device 6DS may be provided for each board production line 1 to prepare a file for each board production line 1. In addition, memory device 6DS may individually prepare a file for recording manipulation log HL0 and a file for recording operation log ML0. In any case, manipulation log HL0 and operation log ML0 are associated with each other based on the date and time when the event occurs.

1-5-2. Acquisition Section 52

When a predetermined trigger event occurs during the board work, acquisition section 52 acquires target manipulation history TH0, target operation history TM0, comparison manipulation history CH0, and comparison operation history CM0 from manipulation log HL0 and operation log ML0 stored in memory device 6DS (step S12 shown in FIG. 6). Target manipulation history TH0 and comparison manipulation history CH0 are acquired from manipulation log HL0, and target operation history TM0 and comparison operation history CM0 are acquired from operation log ML0.

Target manipulation history TH0 is at least one manipulation history related to the trigger event. The trigger event need only be an event that occurs during the board work, but is not limited thereto. For example, the work error detected during execution of the board work by board work machine WM is included in the trigger event. For example, a case is assumed in which board work machine WM is component mounter 10 and the work error is a mounting error of the component.

In this case, the manipulation history related to the attachment and detachment of feeder 20, the reel, the component tray, mounting head 132, the holding member, the nozzle station, and the like used for the component mounting operation is included in target manipulation history TH0. In addition, the manipulation history related to the instruction for changing the operation condition of component mounter 10, such as a change of the control program for driving component mounter 10, is included in target manipulation history TH0. The above description can be similarly applied to other members of device DD0 described above, other board work machine WM, such as the solder printing machine, and the like. That is, the manipulation history related to the attachment and detachment of device DD0 described above is included in target manipulation history TH0. The manipulation history related to the instruction for changing the operation condition of board work machine WM is included in target manipulation history TH0.

It should be noted that the trigger event is not limited to a case in which the work error is detected. For example, an event that an operation state of board work machine WM is not included in an allowable range is included in the trigger event. For example, a case is assumed in which physical quantities (for example, voltage, current, electric power, temperature, pressure, and the like) indicating the operation state of board work machine WM are not included in the allowable range. In this case as well, the same manipulation history as in the case in which the work error is detected is included in target manipulation history TH0.

Figure 7B:
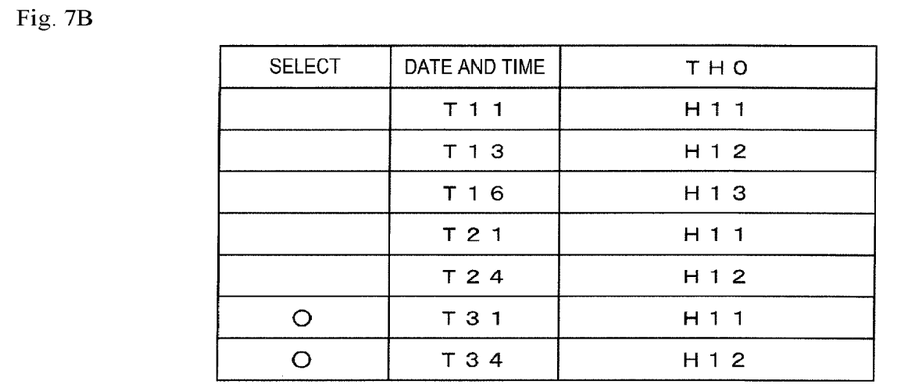
FIG. 7B is a schematic view showing an example of an acquisition method of a target manipulation history.

Acquisition section 52 can present multiple target manipulation histories TH0 to the operator and acquire at least one target manipulation history TH0 selected by the operator. FIG. 7B shows an example of an acquisition method of target manipulation history TH0. FIG. 7B shows an example of information displayed on display device 6DP provided in board production line 1. It should be noted that, for convenience of description, although the manipulation history is shown in FIG. 7B, actually, the manipulation content of the operator recorded in the manipulation history is displayed. In addition, the date and time and the manipulation history (target manipulation history TH0) shown in FIG. 7B correspond to the date and time and the manipulation history shown in FIG. 7A.

For example, a case is assumed in which manipulation history H11, manipulation history H12, and manipulation history H13 among manipulation history H11 to manipulation history H15 shown in FIG. 7A are candidates for target manipulation history TH0. In this case, acquisition section 52 acquires seven target manipulation histories TH0 shown in FIG. 7B from memory device 6DS. Moreover, acquisition section 52 displays, in time series, a check box that can be selected by the operator, the date and time when the manipulation of the operator recorded in target manipulation history TH0 is performed, and the manipulation content of the operator recorded in target manipulation history TH0.

The operator can optionally select at least one target manipulation history TH0 from multiple (seven) target manipulation histories TH0 presented by acquisition section 52. FIG. 7B shows that manipulation history H11 of the manipulation at date and time T31 and manipulation history H12 of the manipulation at date and time T34 are selected by the operator, and acquisition section 52 acquires two manipulation histories as target manipulation history TH0.

In addition, as the manipulation of the operator is closer to the time when the trigger event occurs, a possibility that the manipulation contributes to the occurrence of the trigger event is higher. Accordingly, acquisition section 52 can acquire, as target manipulation history TH0, the manipulation history in which the manipulation performed on board production line 1 by the operator immediately before the time when the trigger event occurs is recorded. In this case, the selection by the operator is not needed. For example, it is assumed that the trigger event occurs at date and time T36 shown in FIG. 7A. In this case, acquisition section 52 acquires manipulation history H12 of manipulation at date and time T34 as target manipulation history TH0.

In addition, acquisition section 52 can acquire multiple target manipulation histories TH0 retroactively in order from the manipulation history in which the manipulation performed on board production line 1 by the operator immediately before the time when the trigger event occurs is recorded. For example, acquisition section 52 can acquire manipulation history H12 of manipulation at date and time T34 and manipulation history H11 of manipulation at date and time T31 as target manipulation history TH0. It should be noted that the number of target manipulation histories TH0 acquired by acquisition section 52 is not limited.

Target operation history TM0 is at least one operation history associated with target manipulation history TH0. For example, a case is assumed in which acquisition section 52 acquires manipulation history H11 of manipulation at date and time T31 and manipulation history H12 of manipulation at date and time T34 as target manipulation history TH0. As shown in FIG. 7A, operation history M31 is the operation history recorded by actuation of board production line 1 at date and time T32 due to the manipulation of the operator at date and time T31.

In addition, operation history M32 is the operation history recorded by actuation of board production line 1 at date and time T33 due to the manipulation of the operator at date and time T31. As described above, operation history M31 and operation history M32 are operation histories of the actuation due to the manipulation of the operator at date and time T31, and are associated with manipulation history H11 (target manipulation history TH0) of manipulation at date and time T31.

Figure 7C:
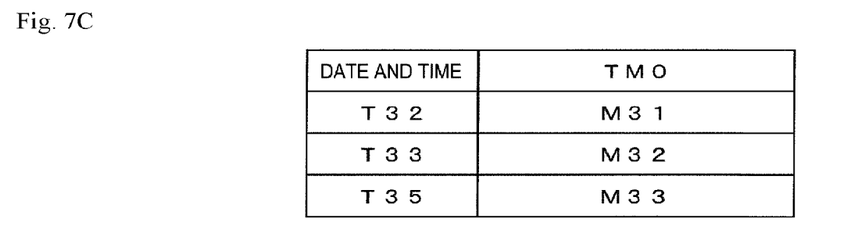
FIG. 7C is a schematic view showing an example of a target operation history.

Similarly, operation history M33 shown in FIG. 7A is associated with manipulation history H12 (target manipulation history TH0) of manipulation at date and time T34. FIG. 7C shows an example of target operation history TM0. In FIG. 7C, operation history M31 of the actuation at date and time T32, operation history M32 of the actuation at date and time T33, and operation history M33 of the actuation at date and time T35 are shown as target operation history TM0.

As described above, multiple target operation histories TM0 may be associated with one target manipulation history TH0, and one target operation history TM0 may also be associated with one target manipulation history TH0. In addition, after multiple manipulations are performed by the operator, board production line 1 may also be actuated due to multiple manipulations. Accordingly, one target operation history TM0 may also be associated with multiple target manipulation histories TH0, or multiple target operation histories TM0 may also be associated with multiple target manipulation histories TH0. It should be noted that, as described above, the association between target manipulation history TH0 and target operation history TM0 is performed by memory section 51.

Comparison manipulation history CH0 is at least one manipulation history that is the same as or similar to target manipulation history TH0. In a case in which the manipulation of the operator recorded in comparison manipulation history CH0 (for example, the order, the interval, and the type of the manipulation) coincides with the manipulation of the operator recorded in target manipulation history TH0 (for example, the order, the interval, and the type of the manipulation), comparison manipulation history CH0 is the same manipulation history as target manipulation history TH0. Comparison manipulation history CH0 including all the manipulations of the operator recorded in target manipulation history TH0 and including another manipulation is included in the manipulation history similar to target manipulation history TH0.

In any case, comparison manipulation history CH0 is the manipulation history including all the manipulations of the operator recorded in target manipulation history TH0. As described above, the manipulation history including all the manipulations of the operator recorded in target manipulation history TH0 is likely to coincide with or similar to the operations of board production line 1 recorded in the associated operation history. Accordingly, acquisition section 52 acquires comparison manipulation history CH0 from manipulation log HL0 stored in memory device 6DS.

Figure 7D:
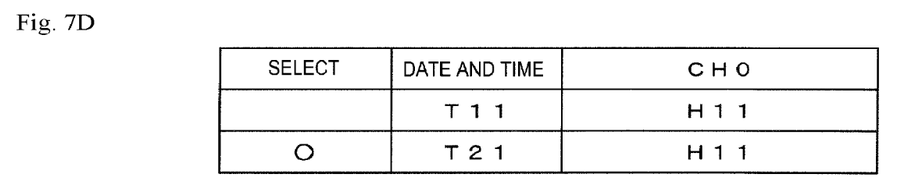
FIG. 7D is a schematic view showing an example of an acquisition method of a comparison manipulation history.

Acquisition section 52 can present multiple comparison manipulation histories CH0 to the operator and acquire at least one comparison manipulation history CH0 selected by the operator. FIG. 7D shows an example of an acquisition method of comparison manipulation history CH0. FIG. 7D shows an example of information displayed on display device 6DP provided in board production line 1. It should be noted that, for convenience of description, although the manipulation history is shown in FIG. 7D, actually, only the check box that can be selected by the operator and the date and time are displayed. In addition, the date and time and the manipulation history (comparison manipulation history CH0) shown in FIG. 7D correspond to the date and time and the manipulation history shown in FIG. 7A.

For example, a case is assumed in which acquisition section 52 acquires manipulation history H11 of the manipulation at date and time T31 shown in FIG. 7A as target manipulation history TH0. It is assumed that manipulation history H11 (target manipulation history TH0) of the manipulation at date and time T31 has the same recorded manipulation (type of manipulation) of the operator as manipulation history H11 of the manipulation at date and time T11 and manipulation history H11 of the manipulation at date and time T21.

In this case, acquisition section 52 can set manipulation history H11 of the manipulation at date and time T11 and manipulation history H11 of the manipulation at date and time T21 as candidates for comparison manipulation history CH0. Acquisition section 52 acquires two comparison manipulation histories CH0 shown in FIG. 7D from memory device 6DS. Moreover, acquisition section 52 displays, in time series, the check box that can be selected by the operator and the date and time when the manipulation of the operator recorded in comparison manipulation history CH0 is performed.

The operator can optionally select at least one comparison manipulation history CH0 from multiple (two) comparison manipulation histories CH0 presented by acquisition section 52. FIG. 7D shows that date and time T21 (manipulation history H11 of the manipulation at date and time T21) is selected by the operator, and acquisition section 52 acquires one manipulation history H11 as comparison manipulation history CH0.

It should be noted that in a case in which acquisition section 52 acquires multiple target manipulation histories TH0, acquisition section 52 can present, to the operator, comparison manipulation history CH0 with respect to target manipulation history TH0 having the earliest date and time of the manipulation by the operator among acquired multiple target manipulation histories TH0. For example, a case is assumed in which acquisition section 52 acquires manipulation history H11 of the manipulation at date and time T31 shown in FIG. 7A and manipulation history H12 of the manipulation at date and time T34 as target manipulation history TH0. It is assumed that manipulation history H11 (target manipulation history TH0) of the manipulation at date and time T31 has the same recorded manipulation (type of manipulation) of the operator as manipulation history H11 of the manipulation at date and time T11 and manipulation history H11 of the manipulation at date and time T21. In addition, it is assumed that manipulation history H12 (target manipulation history TH0) of the manipulation at date and time T34 has the same recorded manipulation (type of manipulation) of the operator as manipulation history H12 of the manipulation at date and time T13 and manipulation history H12 of the manipulation at date and time T24.

In this case, acquisition section 52 can present, to the operator, candidates for comparison manipulation history CH0 with respect to manipulation history H11 of the manipulation at date and time T31 when the date and time of the manipulation by the operator is the earliest among multiple (two) target manipulation histories TH0. For example, as shown in FIG. 7D, in a case in which the operator selects date and time T21 (manipulation history H11 of the manipulation at date and time T21), acquisition section 52 acquires manipulation history H11 of the manipulation at date and time T21 and manipulation history H12 of the manipulation at date and time T24 as comparison manipulation history CH0. In a case in which the operator selects date and time T11 (manipulation history H11 of the manipulation at date and time T11), acquisition section 52 acquires manipulation history H11 of the manipulation at date and time T11 and manipulation history H12 of the manipulation at date and time T13 as comparison manipulation history CH0.

In addition, in a case in which acquisition section 52 acquires multiple (two) target manipulation histories TH0, a case is assumed in which the manipulation history of the manipulation at date and time T34 shown in FIG. 7A is not manipulation history H12, but manipulation history H13. It is assumed that assumed manipulation history H13 (target manipulation history TH0) of the manipulation at date and time T34 has the same recorded manipulation (type of manipulation) of the operator as manipulation history H13 of the manipulation at date and time T16.

In this case, acquisition section 52 can present date and time T11 (manipulation history H11 of the manipulation at date and time T11) to the operator as a candidate for comparison manipulation history CH0. Acquisition section 52 acquires the manipulation histories from date and time T11 to date and time T16 (manipulation history H11 of the manipulation at date and time T11, manipulation history H12 of the manipulation at date and time T13, and manipulation history H13 of the manipulation at date and time T16) as comparison manipulation history CH0.

Acquisition section 52 can also acquire, as comparison manipulation history CH0, the manipulation history having higher coincidence degree with respect to an order, an interval, and a type of a manipulation of the operator recorded in target manipulation history TH0. In this case, the selection by the operator is not needed. For example, the manipulation history of the manipulation (type is a first type) at a predetermined first date and time, the manipulation history of the manipulation (type is a second type) at a second date and time later than the first date and time, and the manipulation history of the manipulation (type is a third type) at a third date and time later than the second date and time are assumed as target manipulation history TH0.

For example, acquisition section 52 acquires, as comparison manipulation history CH0, the manipulation history having the order of the manipulations of the operator recorded in multiple (three) manipulation histories which is closer to the order of the first type of manipulation, the second type of manipulation, and the third type of manipulation. In addition, acquisition section 52 acquires, as comparison manipulation history CH0, the manipulation history having the interval between the manipulations of the operator recorded in multiple (three) manipulation histories which is closer to the interval between the first date and time and the second date and time, and the interval between the second date and time and the third date and time. Further, acquisition section 52 acquires, as comparison manipulation history CH0, the manipulation history having the type of the manipulation of the operator recorded in multiple (three) manipulation histories which do not include manipulation other than manipulations of the first type, the second type, and the third type.

In addition, acquisition section 52 can acquire, as comparison manipulation history CH0, the manipulation history having large number of coinciding elements with respect to the three elements of the order, the interval, and the type of the manipulation of the operator described above. Further, acquisition section 52 can perform weighting on each element of the order, the interval, and the type of the manipulation of the operator described above. In this case, the manipulation history having a higher coincidence degree with respect to the element having large weighting can be easily acquired as comparison manipulation history CH0. The weighting can be changed, for example, depending on the type of board product, or can be set and changed by the operator. In addition, in a case in which comparison manipulation history CH0 is selected by the operator, the coincidence degree can be displayed to take the coincidence degree into account when the operator selects comparison manipulation history CH0.

Comparison operation history CM0 is at least one operation history associated with comparison manipulation history CH0. For example, a case is assumed in which acquisition section 52 acquires manipulation history H11 of the manipulation at date and time T21 shown in FIG. 7A and manipulation history H12 of the manipulation at date and time T24 as comparison manipulation history CH0. Operation history M21 is the operation history recorded by the actuation of board production line 1 at date and time T22 due to the manipulation of the operator at date and time T21.

In addition, operation history M22 is the operation history recorded by the actuation of board production line 1 at date and time T23 due to the manipulation of the operator at date and time T21. As described above, operation history M21 and operation history M22 are operation histories of the actuation due to the manipulation of the operator at date and time T21, and are associated with manipulation history H11 (comparison manipulation history CH0) of the manipulation at date and time T21.

Figure 7E:
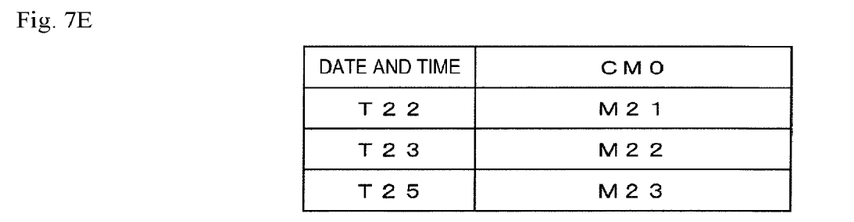
FIG. 7E is a schematic view showing an example of a comparison operation history.

Similarly, operation history M23 is associated with manipulation history H12 (comparison manipulation history CH0) of the manipulation at date and time T24. FIG. 7E shows an example of comparison operation history CM0. In FIG. 7E, operation history M21 of the actuation at date and time T22, operation history M22 of the actuation at date and time T23, and operation history M23 of the actuation at date and time T25 are shown as comparison operation history CM0.

As described above, multiple comparison operation histories CM0 may also be associated with one comparison manipulation history CH0, and one comparison operation history CM0 may be associated with one comparison manipulation history CH0. In addition, as in a case of target operation history TM0, one comparison operation history CM0 may be associated with multiple comparison manipulation histories CH0, or multiple comparison operation histories CM0 may also be associated with multiple comparison manipulation histories CH0. It should be noted that, as described above, the association between comparison manipulation history CH0 and comparison operation history CM0 is performed by memory section 51.

1-5-3. Output Section 53

Output section 53 outputs the operation of board production line 1 recorded in target operation history TM0 and the operation of board production line 1 recorded in comparison operation history CM0, which are acquired by acquisition section 52, in a comparable manner (step S13 shown in FIG. 6).

In the example shown in FIG. 7C, acquisition section 52 acquires operation history M31 of the actuation at date and time T32, operation history M32 of the actuation at date and time T33, and operation history M33 of the actuation at date and time T35 as target operation history TM0. In operation history M31 shown in FIG. 7A, the operations of board production line 1 from date and time T32 to date and time T33 are recorded. In operation history M32, the operations of board production line 1 from date and time T33 to date and time T35 are recorded. In operation history M33, the operations of board production line 1 from date and time T35 to date and time T36 are recorded.

In addition, in the example shown in FIG. 7E, acquisition section 52 acquires operation history M21 of the actuation at date and time T22, operation history M22 of the actuation at date and time T23, and operation history M23 of the actuation at date and time T25 as comparison operation history CM0. In operation history M21 shown in FIG. 7A, the operations of board production line 1 from date and time T22 to date and time T23 are recorded. In operation history M22, the operations of board production line 1 from date and time T23 to date and time T25 are recorded. In operation history M23, the operations of board production line 1 from date and time T25 to date and time T27 are recorded.

Output section 53 outputs the operations (target operations) of board production line 1 recorded in operation history M31, operation history M32, and operation history M33 and the operations (comparison operations) of board production line 1 recorded in operation history M21, operation history M22, and operation history M23 in a comparable manner. That is, output section 53 outputs the operations (target operations) of board production line 1 from date and time T32 to date and time T36 when the trigger event occurs, and the operations (comparison operations) of board production line 1 from date and time T22 to date and time T27 in a comparable manner. As a result, for example, the engineer who is the manufacturer or the user of board production line 1 can compare the target operation with the comparison operation, and, for example, can perform the factor analysis of the trigger event.

Output section 53 need only to be able to output the operations of board production line 1 in a comparable manner, and an output method is not limited. For example, in target operation history TM0 and comparison operation history CM0, a detection signal of detector SS0 that detects the mounting state, the detachment state, or the operation state of device DD0 detachably provided on board work machine WM is recorded. In this case, output section 53 can display a temporal change of the detection signal in a comparable manner as the operations of board production line 1 recorded in target operation history TM0 and comparison operation history CM0.

Mounting head 132 shown in FIG. 2 is moved in the XY-directions integrally with moving body 131 by the linear motion mechanism of head driving device 13. The linear motion mechanism includes, for example, an electric motor, such as a servo motor, and the electric motor is provided with position detector SS11, such as an encoder. As a result, the control device that controls component mounter 10 can recognize the positions of moving body 131 and mounting head 132. That is, position detector SS11 is included in detector SS0 that detects the operation state of mounting head 132.

Figure 8A:
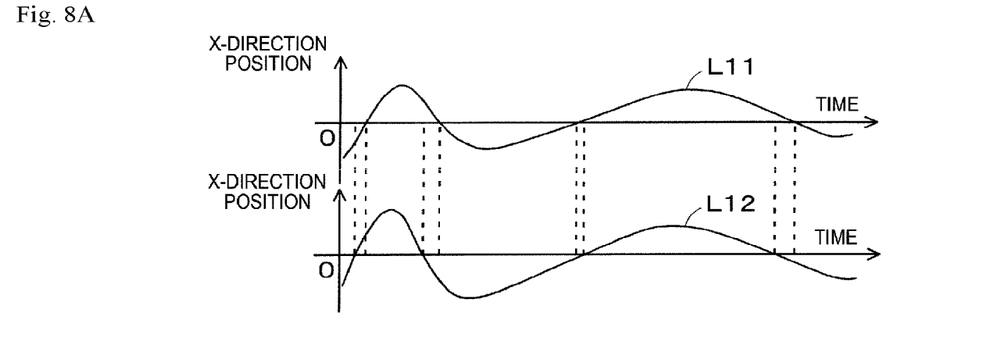
FIG. 8A is a schematic view showing an example of a temporal change of a detection signal of a detector that detects an operation state of a device (mounting head).

FIG. 8A shows an example of the temporal change of the detection signal of detector SS0 (position detector SS11) that detects the operation state of device DD0 (mounting head 132). Curve L11 shows an example of the temporal change of the detection signal of position detector SS11 recorded in comparison operation history CM0. Curve L11 represents the operation history of mounting head 132 in the set of operation histories of each device of component mounter 10 recorded in operation history M21, operation history M22, and operation history M23, as the temporal change of the detection signal of position detector SS11.

Curve L12 shows an example of the temporal change of the detection signal of position detector SS11 recorded in target operation history TM0. Curve L12 represents the operation history of mounting head 132 in the set of operation histories of each device of component mounter 10 recorded in operation history M31, operation history M32, and operation history M33, as the temporal change of the detection signal of position detector SS11. In any case, a horizontal axis represents the time, and a vertical axis represents an X-direction position of mounting head 132.

The operation (target operation) of mounting head 132 represented by curve L12 differs from the operation (comparison operation) of mounting head 132 represented by curve L11 in the timing of the zero cross of the X-direction position of mounting head 132. For example, the engineer who is the manufacturer or the user of board production line 1 can compare the target operation with the comparison operation based on the display shown in FIG. 8A, and can perform, for example, the factor analysis of the trigger event. In this case, for example, there is a possibility that the operation of mounting head 132 is one factor of the trigger event.

Feeder 20 shown in FIG. 2 is detachably provided in component mounter 10 that is board work machine WM, and is included in device DD0. Attachment/detachment detector SS12 that detects the mounting state or the detachment state of feeder 20 can be provided in first slot 121 or second slot 122 of component mounter 10. As a result, the control device that controls component mounter 10 can recognize the mounting state or the detachment state of feeder 20 by a method other than the propriety of communication with the control device of feeder 20. That is, attachment/detachment detector SS12 is included in detector SS0 that detects the mounting state or the detachment state of feeder 20.

Figure 8B:
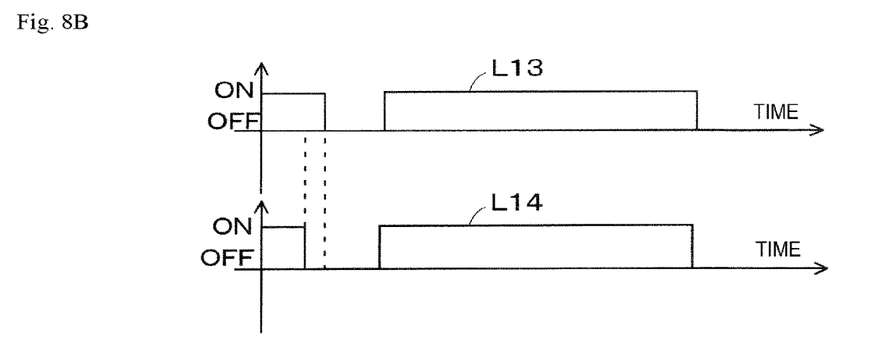
FIG. 8B is a schematic view showing an example of a temporal change of a detection signal of a detector that detects a mounting state or a detachment state of a device (feeder).

FIG. 8B shows an example of the temporal change of the detection signal of detector SS0 (attachment/detachment detector SS12) that detects the mounting state or the detachment state of device DD0 (feeder 20). Polygonal line L13 shows an example of the temporal change of the detection signal of attachment/detachment detector SS12 recorded in comparison operation history CM0. Polygonal line L13 represents the operation history of the attachment/detachment operation of feeder 20 in the set of operation histories of each device of component mounter 10 recorded in operation history M21, operation history M22, and operation history M23, by the temporal change of the detection signal of position detector SS12.

Polygonal line L14 shows an example of the temporal change of the detection signal of attachment/detachment detector SS12 recorded in target operation history TM0. Polygonal line L14 represents the operation history of the attachment/detachment operation of feeder 20 in the set of operation histories of each device of component mounter 10 recorded in operation history M31, operation history M32, and operation history M33, by the temporal change of the detection signal of position detector SS12. In any case, the horizontal axis represents the time, and the vertical axis represents the mounting state (ON) or the detachment state (OFF) of feeder 20.

The operation (target operation) of attaching and detaching feeder 20 represented by polygonal line L14 has a location in which transition from the mounting state (ON) to the detachment state (OFF) is faster than the operation (comparison operation) of attaching and detaching feeder 20 represented by polygonal line L13. That is, the target operation has a location in which the detachment of feeder 20 is faster than the comparison operation. The engineer who is the manufacturer or the user of board production line 1 can compare the target operation with the comparison operation based on the display shown in FIG. 8B, and can perform, for example, the factor analysis of the trigger event. It should be noted that detector SS0 that detects the operation state of device DD0 includes a detector, such as a proximity sensor or a limit switch. A detection state (ON) or a non-detection state (OFF) is output from these detectors, and the detection signal is changed in the same manner as the temporal change shown in FIG. 8B.

Figure 8C:
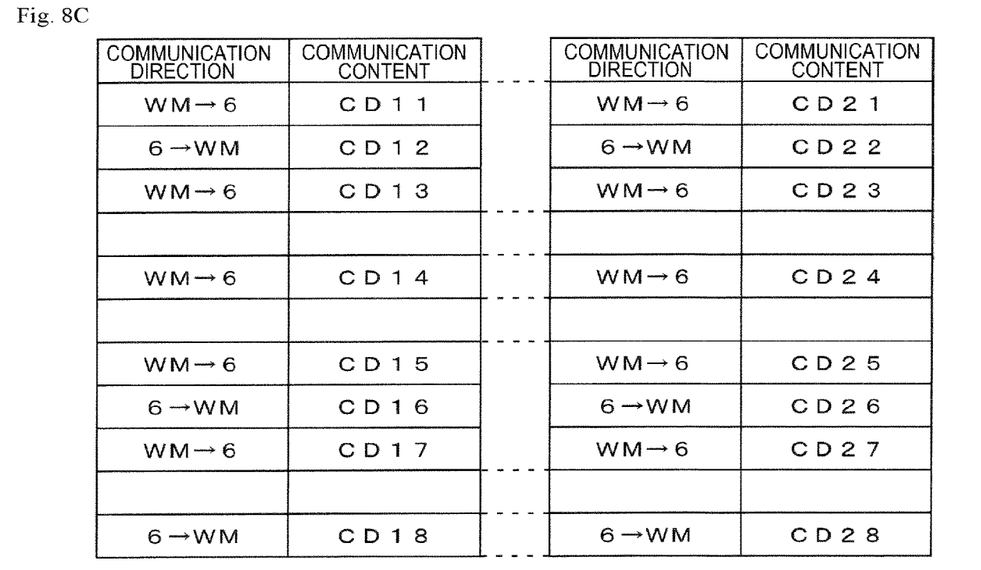
FIG. 8C is a schematic view showing an example of a temporal change of a communication state between a line control computer and the component mounter.

As described above, each device constituting board production line 1 shown in FIG. 1 is configured to be capable of communicating with line control computer 6 via the network. FIG. 8C shows an example of the temporal change of a communication state between line control computer 6 and component mounter 10. A communication history on a paper left side of FIG. 8C is communication (comparison operation) between line control computer 6 and component mounter 10 recorded in comparison operation history CM0. The communication history on the paper left side of FIG. 8C represents the communication history (operation history) with line control computer 6 in the set of operation histories of each device of component mounter 10 recorded in operation history M21, operation history M22, and operation history M23, by a communication content.

The communication history on the paper right side of FIG. 8C is communication (target operation) between line control computer 6 and component mounter 10 recorded in target operation history TM0. The communication history on the paper right side of FIG. 8C represents the communication history (operation history) with line control computer 6 in the set of operation histories of each device of component mounter 10 recorded in operation history M31, operation history M32, and operation history M33, by the communication content.

In any case, "WM→6" in a communication direction represents transmission from component mounter 10 that is board work machine WM to line control computer 6, and "6→WM" represents reception from line control computer 6 of component mounter 10. The communication content is schematically shown by, for example, a communication command. The communication content of the comparison operation is represented by command CD11 to command CD18, and the communication content of the target operation is represented by command CD21 to command CD28. In this case as well, the engineer who is the manufacturer or the user of board production line 1 can compare the target operation with the comparison operation based on the display shown in FIG. 8C, and can perform, for example, the factor analysis of the trigger event.

1-5-4. Analysis Section 54

When the trigger event is the work error detected during the execution of the board work by board work machine WM, analysis section 54 performs the factor analysis of the work error based on a difference between the operations of board production line 1 recorded in target operation history TM0 and comparison operation history CM0 (step S14 shown in FIG. 6).

For example, the operation (target operation) of mounting head 132 represented by curve L12 shown in FIG. 8A differs from the operation (comparison operation) of mounting head 132 represented by curve L11 in the timing of the zero cross of the X-direction position of mounting head 132. In this case, analysis section 54 can cite, for example, the operation of mounting head 132 as one factor of the work error (for example, a holding error of the component) based on the difference between the target operation and the comparison operation (difference in the timing of the zero cross). Analysis section 54 can cite the factor of the work error in the same manner in the examples shown in FIG. 8B and FIG. 8C.

It should be noted that the work error is detected, for example, in board work machine WM on which the board work is performed. Board work machine WM includes various imaging devices. For example, in a case in which board work machine WM is component mounter 10, component mounter 10 includes an imaging device capable of imaging the component held by the holding member. Component mounter 10 performs image processing on an image captured by the imaging device, and recognizes a holding state of the component by the holding member. Component mounter 10 detects the work error (holding error of the component) when the holding state of the component is not included in a predetermined state. It should be noted that a type of work error is not limited.

1-5-5. Collection Section 55

Collection section 55 collects the operation history when the work error is detected and the factor of the work error in association with each other (step S15 shown in FIG. 6).

When the factor analysis of the work error is performed, for example, by the engineer who is the manufacturer or the user of board production line 1, collection section 55 stores the operation history when the work error is detected and the factor of the work error in memory device 6DS in association with each other. In addition, when the factor analysis of the work error is performed by analysis section 54, collection section 55 stores the operation history when the work error is detected and the factor of the work error in memory device 6DS in association with each other.

As described above, when the operation history when the work error is detected and the factor of the work error are accumulated, a correlation between the operation of board production line 1 recorded in the operation history and the factor of the work error may be able to be grasped. The correlation can be grasped by, for example, a statistical method, or can be grasped by, for example, an artificial intelligence method, such as a neural network or deep learning.

For example, when acceleration during the movement of mounting head 132 exceeds a predetermined value, the holding state of the component held by the holding member may not be stable. For example, in a case in which learning data in which the holding error of the component is detected include a large amount of learning data in which the acceleration during the movement of mounting head 132 is larger than the predetermined value, there is a possibility that the excess of the acceleration during the movement of mounting head 132 is one factor of the holding error of the component.

When the operation of board production line 1 recorded in target operation history TM0 on which the factor analysis is currently performed and the operation of board production line 1 recorded in the past operation history collected by collection section 55 are the same as or similar to each other, analysis section 54 outputs the factor of the work error associated with the operation history collected by collection section 55.

Normally, since it is rare that the operations of board production line 1 coincide completely with each other, analysis section 54 can determine that the operations of board production line 1 are similar to each other when main portions of the operations of board production line 1 approximate each other. In the example shown in FIG. 8A, a variation pattern of the X-direction position of mounting head 132 shown by curve L12 (in which the increase and decrease of the X-direction position are repeated), the timing of the zero cross of the X-direction position and the like are included in main portions. When the operation that is the same as or similar to the operation of mounting head 132 shown by curve L12 is recorded in the past operation history collected by collection section 55, analysis section 54 outputs the factor of the work error associated with the operation history collected by collection section 55.

2. Others

Board production line 1 of the present embodiment includes board work machine WM, storage device 5, and article moving device 40. Storage device 5 can store, in addition to feeder 20, article AR0 needed for the production of the board product by board work machine WM. For example, device DD0 described above is included in article AR0. Similarly, article moving device 40 can supply, in addition to feeder 20, article AR0 stored in storage device 5 to board work machine WM, and collect article AR0 that is no longer needed in board work machine WM in storage device 5.

In addition to the manipulation history of the operator with respect to board work machine WM, the manipulation histories of the operator with respect to storage device 5 and article moving device 40 can be recorded in manipulation log HL0. In addition, in addition to the operation history of board work machine WM, the operation histories of storage device 5 and article moving device 40 can be recorded in operation log ML0. When the operation histories of board work machine WM, storage device 5, and article moving device 40 are recorded in operation log ML0, the type of the operation history is increased as compared with a case in which the operation history of only board work machine WM is recorded, so that the amount of information of the operation history stored in memory device 6DS is likely to be increased. Therefore, it is advantageous to apply trace assistance device 50 of the present embodiment.

In addition, in the present embodiment, component mounter 10 that is board work machine WM includes first slot 121 and second slot 122. Another board work machine WM can also include first slot 121 and second slot 122, and article AR0 to be held is not limited to feeder 20. That is, board work machine WM can include first slot 121 that holds article AR0 needed for the production of the board product in an exchangeable manner, and second slot 122 that can preliminarily hold article AR0 or can temporarily hold article AR0 to be collected. In addition, article moving device 40 can perform the exchange operation of article AR0 between first slot 121 and second slot 122.

In this case, in operation log ML0, the operation history of the exchange operation of article AR0 by article moving device 40 can be recorded. When the operation history of the exchange operation of article AR0 by article moving device 40 is recorded in operation log ML0, the type of the operation history is increased as compared with a case in which only a movement history between storage device 5 and board work machine WM is recorded as the operation history of article moving device 40, so that the amount of information of the operation history stored in memory device 6DS is likely to be increased. Therefore, it is advantageous to apply trace assistance device 50 of the present embodiment.

3. Trace Assistance Method

The above description of trace assistance device 50 can be similarly applied to a trace assistance method. Specifically, the trace assistance method includes a memory step, an acquisition step, and an output step. The memory step corresponds to the control performed by memory section 51. The acquisition step corresponds to the control performed by acquisition section 52. The output step corresponds to the control performed by output section 53. In addition, the trace assistance method can further include an analysis step. The trace assistance method can further include an analysis step and a collection step. The analysis step corresponds to the control performed by analysis section 54. The collection step corresponds to the control performed by collection section 55.

It should be noted that in the acquisition step, target manipulation history TH0, target operation history TM0, comparison manipulation history CH0, and comparison operation history CM0 can be acquired in any order. Note that target operation history TM0 is acquired simultaneously with target manipulation history TH0 or after acquiring target manipulation history TH0, and comparison operation history CM0 is acquired simultaneously with comparison manipulation history CH0 or after acquiring comparison manipulation history CH0.

4. Example of Effects of Embodiment

Trace assistance device 50 includes memory section 51, acquisition section 52, and output section 53. Accordingly, trace assistance device 50 can output the operation of board production line 1 recorded in target operation history TM0 associated with target manipulation history TH0 related to the trigger event, and the operation of board production line 1 recorded in comparison operation history CM0 associated with comparison manipulation history CH0 that is the same as or similar to target manipulation history TH0 in a comparable manner. The above description of trace assistance device 50 can be similarly applied to the trace assistance method.

REFERENCE SIGNS LIST

1: board production line, 121: first slot, 122: second slot, 5: storage device, 40: article moving device, 50: trace assistance device, 51: memory section, 52: acquisition section, 53: output section, 54: analysis section, 55: collection section, 6DS: memory device, 90: board, AR0: article, HL0: manipulation log, ML0: operation log, TH0: target manipulation history, TM0: target operation history, CH0: comparison manipulation history, CM0: comparison operation history, DD0: device, SS0: detector, WM: board work machine

The invention claimed is:
1. A trace assistance device comprising:
a memory configured to store a manipulation log in which multiple manipulation histories of an operator with respect to a board production line including a board work machine configured to perform predetermined board work on a board are recorded, and an operation log in which multiple operation histories of the board production line actuated due to a manipulation of the operator are recorded in association with each other in a memory device; and a processor configured to
- when a predetermined trigger event occurs during the board work, acquire a target manipulation history which is at least one manipulation history related to the trigger event, a target operation history which is at least one operation history associated with the target manipulation history, a comparison manipulation history which is at least one manipulation history that is the same as or approximates the target manipulation history, and a comparison operation history which is at least one operation history associated with the comparison manipulation history from the manipulation log and the operation log stored in the memory device; and
- output an operation of the board production line recorded in the target operation history and an operation of the board production line recorded in the comparison operation history, which are acquired by the processor, in a comparable manner.

2. The trace assistance device according to claim 1, wherein the processor is configured to present multiple target manipulation histories to the operator and acquire at least one target manipulation history selected by the operator.

3. The trace assistance device according to claim 1, wherein the processor is configured to acquire the manipulation history in which a manipulation performed on the board production line by the operator immediately before a time when the trigger event occurs is recorded as the target manipulation history.

4. The trace assistance device according to claim 1, wherein the processor is configured to acquire multiple target manipulation histories retroactively in order from the manipulation history in which a manipulation performed on the board production line by the operator immediately before a time when the trigger event occurs is recorded.

5. The trace assistance device according to claim 1, wherein the processor is configured to present multiple comparison manipulation histories to the operator and acquire at least one comparison manipulation history selected by the operator.

6. The trace assistance device according to claim 1, wherein the processor is configured to acquire, as the comparison manipulation history, the manipulation history having a higher coincidence degree with respect to an order, an interval, and a type of a manipulation of the operator recorded in the target manipulation history.

7. The trace assistance device according to claim 1, wherein the comparison manipulation history is the manipulation history including all manipulations of the operator recorded in the target manipulation history.

8. The trace assistance device according to claim 1, wherein a detection signal of a detector configured to detect a mounting state, a detachment state, or an operation state of a device detachably provided in the board work machine is recorded in the target operation history and the comparison operation history, and the processor is configured to display a temporal change of the detection signal in a comparable manner as operations of the board production line recorded in the target operation history and the comparison operation history.

9. The trace assistance device according to claim 1, wherein the trigger event is a work error detected during execution of the board work by the board work machine, and
wherein the processor is configured to perform a factor analysis of the work error based on a difference between operations of the board production line recorded in the target operation history and the comparison operation history.

10. The trace assistance device according to claim 9, wherein the processor is configured to
collect the operation history when the work error is detected and a factor of the work error in association with each other, and
when an operation of the board production line recorded in the target operation history on which the factor analysis is currently performed and an operation of the board production line recorded in a past operation history collected by the processor are the same as or approximates each other, output the factor of the work error associated with the operation history collected by the processor.

11. The trace assistance device according to claim 1, wherein the board production line further includes a storage device configured to store an article needed for production of a board product by the board work machine, and an article moving device configured to supply the article stored in the storage device to the board work machine and collect the article, which is no longer needed in the board work machine, to the storage device, and
the operation histories of the board work machine, the storage device, and the article moving device are recorded in the operation log.

12. The trace assistance device according to claim 11, wherein the board work machine includes a first slot configured to hold the article needed for production of the board product in an exchangeable manner, and a second slot configured to preliminarily hold the article or temporarily hold the article to be collected,
the article moving device is configured to perform an exchange operation of the article between the first slot and the second slot, and
the operation history of the exchange operation of the article by the article moving device is recorded in the operation log.

13. A trace assistance method comprising:
a memory step of storing a manipulation log in which multiple manipulation histories of an operator with respect to a board production line including a board work machine configured to perform predetermined board work on a board are recorded, and an operation log in which multiple operation histories of the board production line actuated due to a manipulation of the operator are recorded in association with each other in a memory device;
an acquisition step of, when a predetermined trigger event occurs during the board work, acquiring a target manipulation history which is at least one manipulation history related to the trigger event, a target operation history which is at least one operation history associated with the target manipulation history, a comparison manipulation history which is at least one manipulation history that is the same as or approximates the target manipulation history, and a comparison operation history which is at least one operation history associated with the comparison manipulation history from the manipulation log and the operation log stored in the memory device; and an output step of outputting an operation of the board production line recorded in the target operation history and an operation of the board production line recorded in the comparison operation history, which are acquired in the acquisition step, in a comparable manner.

\* \* \* \* \*